United States Patent
Mathur et al.

(10) Patent No.: US 10,615,815 B2
(45) Date of Patent: Apr. 7, 2020

(54) HIGH-LINEARITY FLASH ANALOG TO DIGITAL CONVERTER

(71) Applicant: Maxliner, Inc., Carlsbad, CA (US)

(72) Inventors: Rishi Mathur, Bengaluru (IN); Chandrajit Debnath, Bengaluru (IN); Abhishek Ghosh, Bengaluru (IN); Anand Mohan Pappu, Bengaluru (IN)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 16/400,431

(22) Filed: May 1, 2019

(65) Prior Publication Data

US 2019/0341926 A1    Nov. 7, 2019

Related U.S. Application Data

(60) Provisional application No. 62/686,699, filed on Jun. 19, 2018.

(30) Foreign Application Priority Data

May 2, 2018    (IN) .............................. 201811016618

(51) Int. Cl.
*H03M 1/36* (2006.01)
*H03M 3/00* (2006.01)
*H03M 1/06* (2006.01)

(52) U.S. Cl.
CPC ........... *H03M 1/361* (2013.01); *H03M 1/066* (2013.01); *H03M 3/338* (2013.01)

(58) Field of Classification Search
None
See application file for complete search history.

(56) References Cited

U.S. PATENT DOCUMENTS

| 6,426,714 B1 * | 7/2002 | Ruha ..................... H03M 1/066 341/143 |
| 7,760,121 B2 * | 7/2010 | Lakdawala ......... H03M 1/0665 341/144 |

(Continued)

OTHER PUBLICATIONS

Eric Fogleman et al., A 33-V Single-Poly CMOS Audio ADC Delta-Sigma Modulator with 98-dB Peak Sinad and 105-dB Peak SFDR, IEEE Journal of Solid-State Circuits, vol. 35, No. 3, Mar. 2000. pp. 297-307.

(Continued)

*Primary Examiner* — Howard Williams
(74) *Attorney, Agent, or Firm* — Maschoff Brennan; Jason W. Croft

(57) ABSTRACT

An analog-to-digital converter circuit comprises code-shuffling circuitry, a plurality of digital-to-analog converter circuits, a plurality of difference circuits, and a plurality of latch circuits. The code-shuffling circuitry is operable to shuffle a plurality of digital codes among a plurality of its outputs. The plurality of digital-to-analog converter circuits are operable to convert a digital code on the respective one of the outputs to a corresponding one of a plurality of analog reference voltages. The plurality of difference circuits is operable to generate a respective one of a plurality of difference signals corresponding to a difference between an input voltage and a respective one of the plurality of reference voltages. The plurality of latch circuits is operable to latch a respective one of the plurality of difference signals to a corresponding one of a plurality of digital values.

20 Claims, 6 Drawing Sheets

(56) References Cited

U.S. PATENT DOCUMENTS

2002/0186776 A1* 12/2002 Cosand ................ H03M 3/338
375/247
2007/0241950 A1* 10/2007 Petilli ................ H03M 1/0663
341/143

OTHER PUBLICATIONS

Yunzhi Dong, Adaptive Digital Noise-Cancellation Filtering using Cross-Correlators for Continuous-Time MASH ADC in 28nm CMOS, 978-1-5090-5191-5/17/2017 IEEE (4 pgs).

* cited by examiner

HIGH-LINEARITY FLASH ANALOG TO DIGITAL CONVERTER

PRIORITY CLAIM

This application claims priority to Indian provisional patent application 201811016618 filed May 2, 2018. This application also claims priority to U.S. provisional patent application 62/686,699 filed Jun. 19, 2018. Each of the above-referenced documents is hereby incorporated herein by reference in its entirety.

BACKGROUND

Limitations and disadvantages of conventional and traditional approaches to analog-to-digital conversion will become apparent to one of skill in the art, through comparison of such systems with some aspects of the present invention as set forth in the remainder of the present application with reference to the drawings.

BRIEF SUMMARY OF THE INVENTION

A system and/or method is provided for a high-linearity flash analog to digital converter, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Figure 1A:
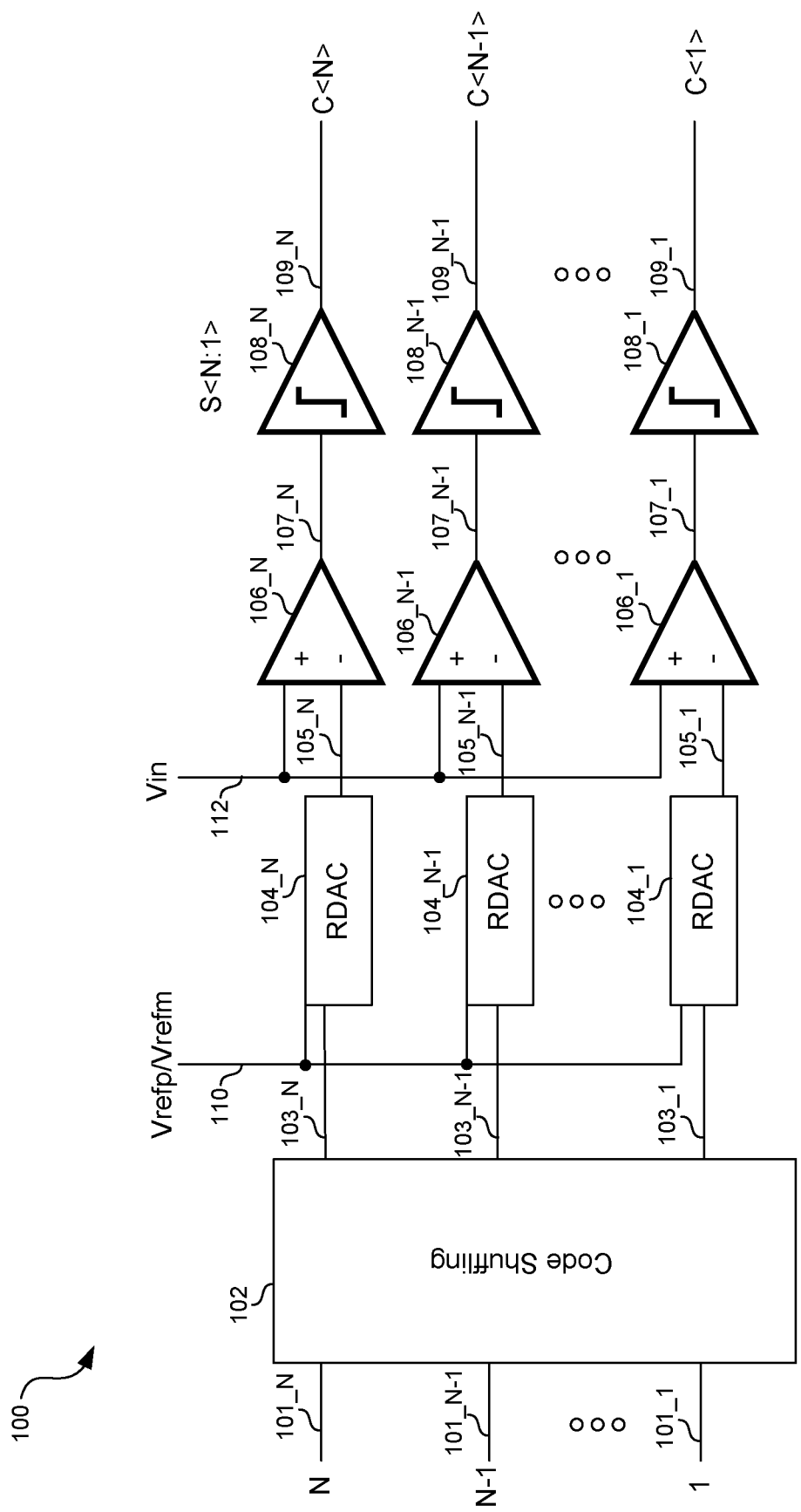
FIGS. 1A-1C show example implementations of a flash analog-to-digital converter (ADC) with resistive digital-to-analog converter (RDAC) generated references.

FIG. 1A shows an example flash analog-to-digital converter (ADC) with resistive digital-to-analog converter (RDAC) generated references. The example flash ADC with RDAC-generated references 100 comprises code-shuffling circuitry 102, RDACs 104_1 to 104_N, active subtractor circuits 106_1 to 106_N, and latch circuits 108_1 to 108_N (where N is an integer).

The code-shuffling circuitry 102 is operable to receive N digital codes 101_1 to 101_N, each of which may be a unique $\log_2(N)$-bit value. The code-shuffling circuitry 102 is operable to couple each digital code 101_$n$ to a RDAC input 103_$m$ (where n and m are integers; 1≤n≤N; 1≤m≤N, and n may be equal to or different than m). Which digital code 101_$n$ is connected to which RDAC input 103_$m$ may, for example, be changed occasionally or periodically such that any one or more of the digital codes 101_$n$ is shuffled among multiple of the RDAC inputs 103_1 to 103_N over time. This shuffling of the digital codes, thus shuffles the reference voltages 105_1 to 105_N generated by the RDACs 104_1 to 104_N. Shuffling the reference voltages 105_1 to 105_N helps to mitigate the effects of variations (e.g., mismatch of circuit elements) in the ADC 100. Such variations may include variations among the subtractors 106_1 to 106_N, variations among the RDACS 104_1 to 104_N, and/or variations among the latches 108_1 to 108_N. For example, the shuffling may reduce spurs or tones (which were not part of a sinusoidal input signal) occurring in the output signal 109 due to device mismatches, random offsets, etc. that are inevitable in any non-ideal system.

Each RDAC 104_$n$ is operable to generate an analog voltage 105_$n$ corresponding to the digital code applied to its input 103_$n$. Each RDAC 104_$n$ may be, for example, a thermometric resistive DAC or a binary resistive DAC or an R2R DAC.

Each active subtractor circuit 106_$n$ is operable to generate, as signal 107_$n$, a voltage corresponding to the difference between Vin, which is the voltage to be converted to digital by the ADC 100, and the reference voltage 105_$n$ generated by RDAC 104_$n$.

Each latch circuit 108_$n$ is operable to latch the value of signal 107_$n$ as signal 109_$n$. In an example implementation, the outputs of the ADC 100 is a thermometric representation of the digital output and 109_N-109_1 are the N thermometric bits whose sum represents the value of digital output, which can vary from 0 to N. In an example implementation in which the output of the ADC 100 is desired to be in binary format, a thermometric-to-binary encoder may be added at the output. The thermometric-to-binary encoder can be a simple summing circuit which adds the values of the N binary signals 109_1 to 109_N.

One advantage of the architecture of ADC 100 is that it there is no analog reference voltage to be physically multiplexed. Instead, the digital codes 101_1 to 101_N are shuffled. The digital codes have shorter settling times than analog reference voltages and thus this shuffling can be done much faster than multiplexing of analog reference voltages. This is aided by the fact that settling of each RDAC 104_$n$ requires charging just the local gate capacitance of 106_$n$. The shuffling logic may be heavily optimized to achieve minimal code-shuffling delay.

Figure 1B:
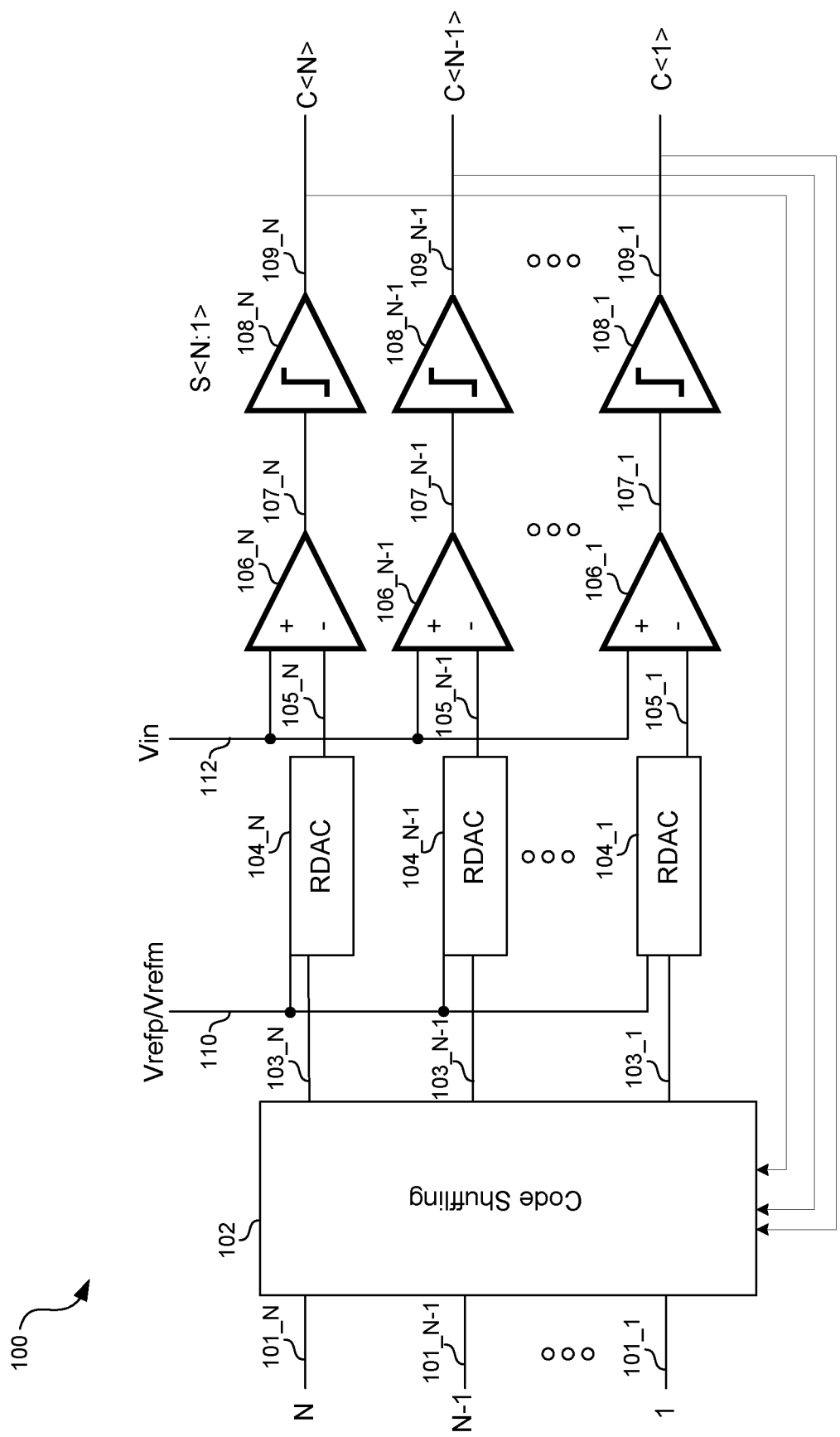

In an example implementation shown in FIG. 1B, the code-shuffling 102 may be controlled to implement data-dependent dynamic element matching (DEM) techniques and incorporate mismatch shaping. The digital output signal 109 (comprising bits 109_1-109_N) may be fed back to realize DEM logic 111 and control the code-shuffling 102. In such an implementation, code-shuffling 102 settling and RDAC settling will be a part of the DEM timing loop only.

Figure 1C:
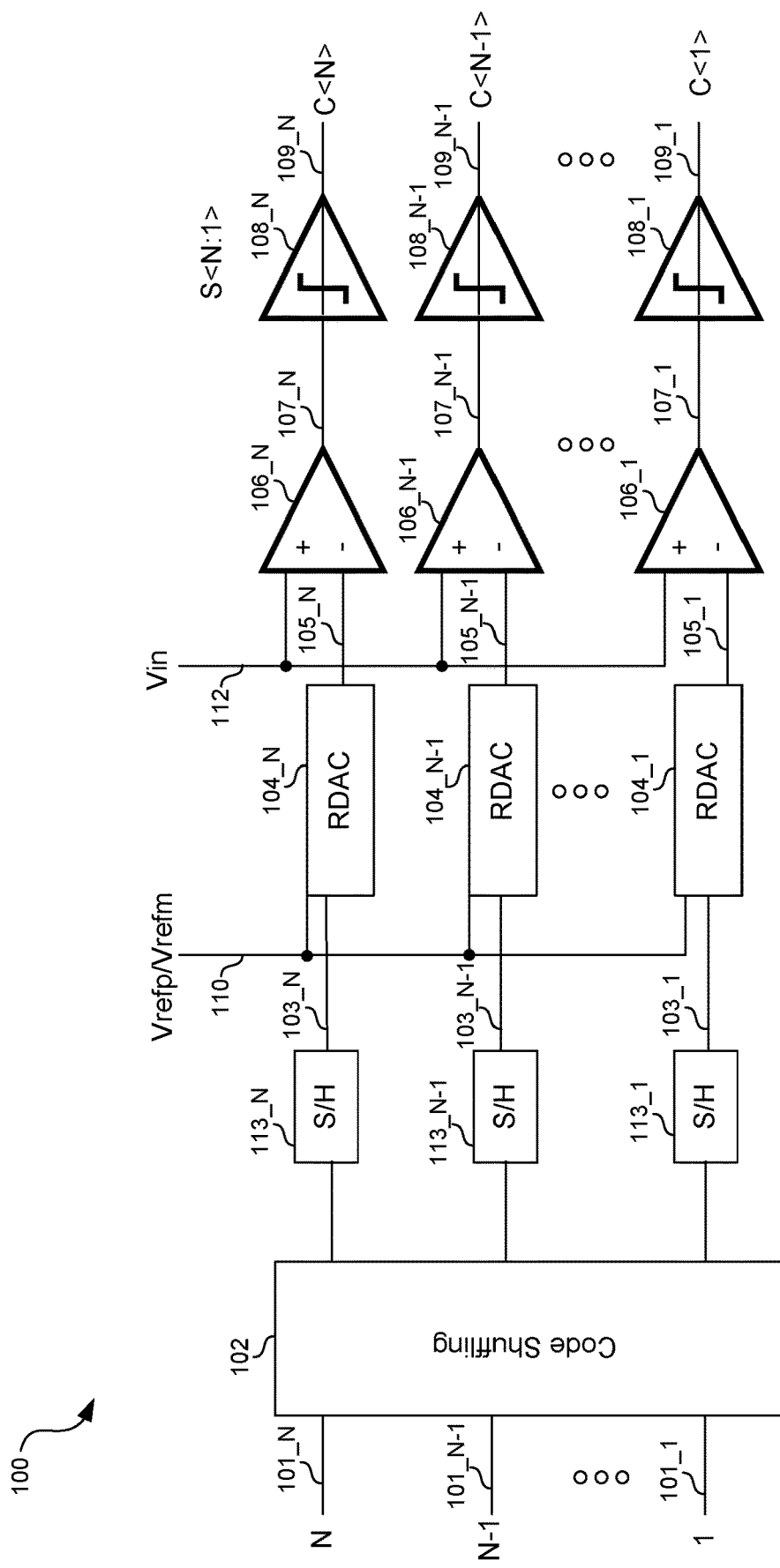
Figure 2:
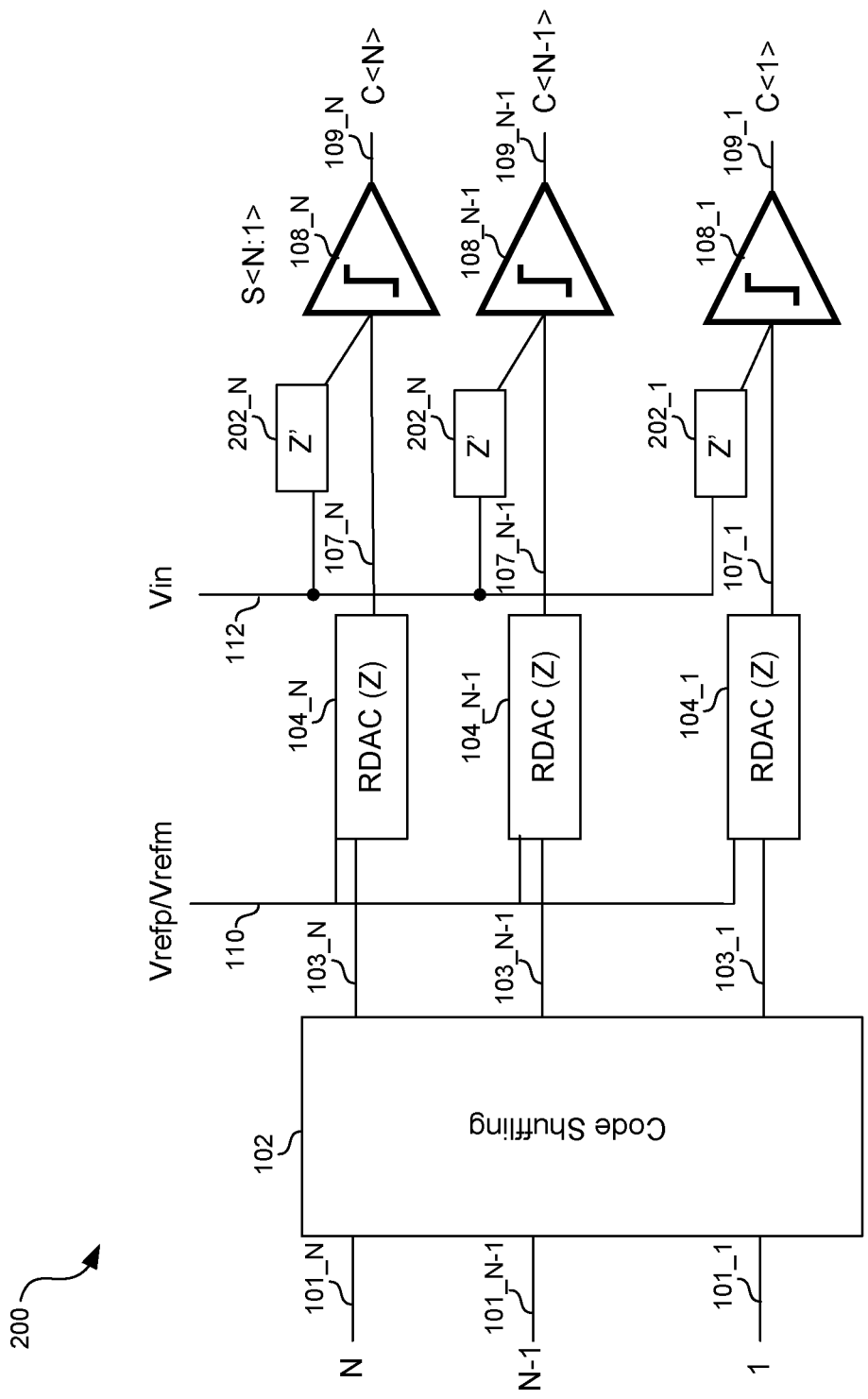
FIG. 2 shows an example flash ADC with RDAC-generated references and passive reference subtraction.

In an example implementation shown in FIG. 1C, delay of the code-shuffling 102 is totally de-coupled from settling delay of the RDACS 104_1 to 104_N by sample and hold circuits 113_1 to 113_N FIG. 2 shows an example flash ADC with RDAC-generated references and passive reference subtraction. The ADC 200 is similar to the ADC 100 of FIG. 1 except the active subtractor circuits 106_1 to 106_N have been replaced by passive subtractor circuits 202_1 to 202_N, which can offer substantial power savings and reduce the overall latency of the ADC 200 relative to ADC 100.

In an example implementation, by configuring the RDAC 104_$n$ to have output impedance that is independent of the code 103_$n$, the subtraction is achieved by shorting 112 to 107_$n$ through an appropriate impedance 202_$n$.

In an example implementation, the RDACS 104_1 to 104_N are capacitive DACs and their inputs are sampled and held and impedances 202_1 to 202_N are capacitors.

Figure 3:
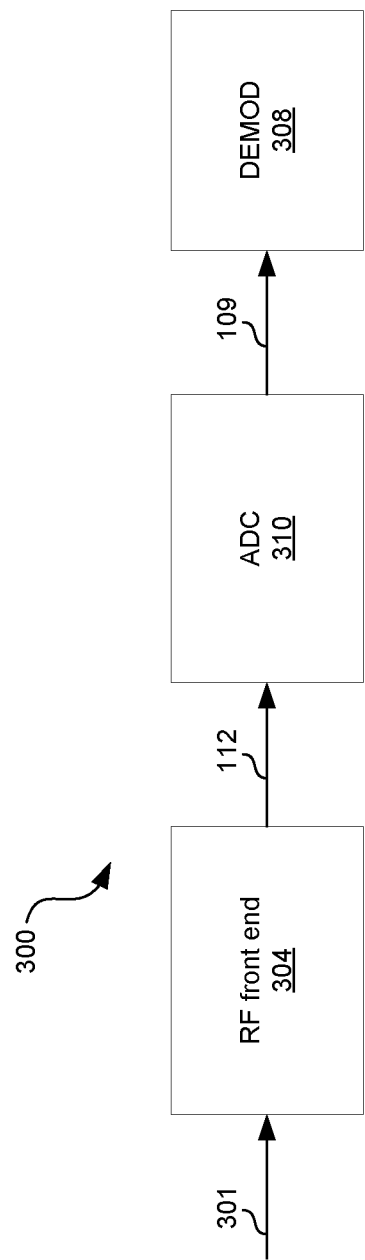
FIG. 3 shows an example receiver comprising a flash ADC.

FIG. 3 shows an example receiver 300 comprising a flash ADC. The receiver comprises a radio frequency (RF) front end circuit 304, an instance of analog-to-digital converter 310, and demodulator circuit 308.

Figure 4:
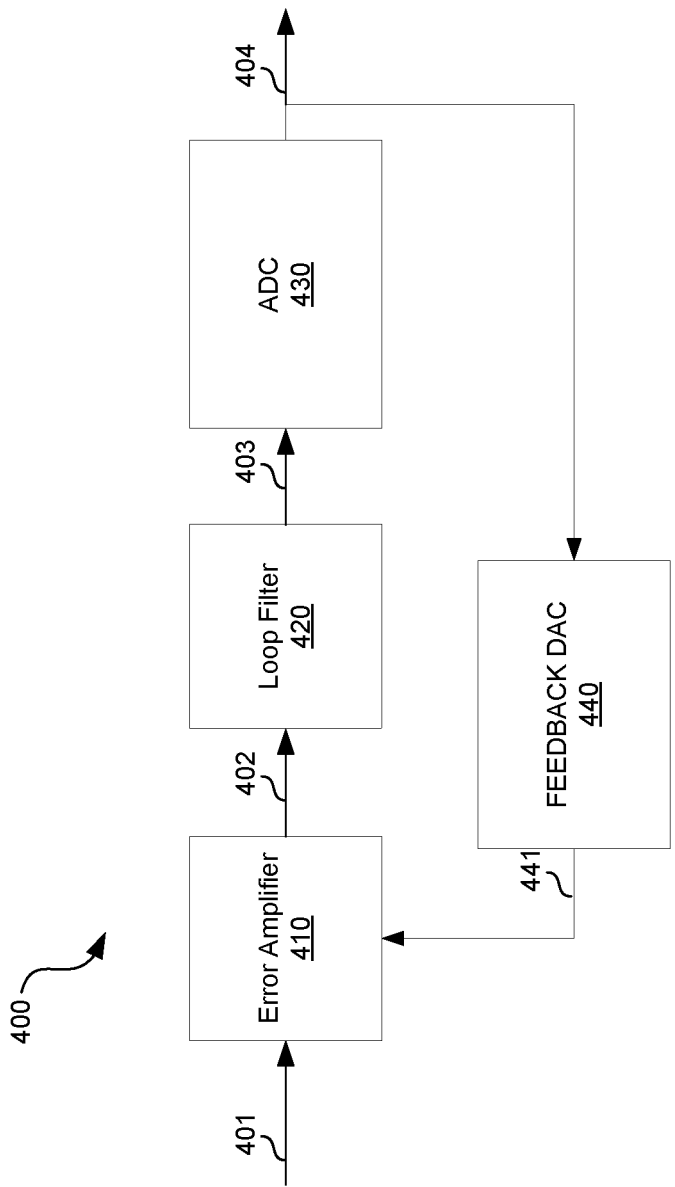
FIG. 4 shows an example DSM modulator comprising a flash ADC.

FIG. 4. Shows an example Delta-Sigma Modulator comprising a flash ADC. The Delta-Sigma modulator comprises an error amplifier 410, a loop filter 420, an instance of analog-to-digital converter 430 and a feedback digital-to-analog converter 440.

The error amplifier 410 comprises circuitry operable to generate error signal 402 which is equal to the input signal 401 minus the signal 441 output by feedback DAC 440.

The loop filter 420 comprises circuitry operable to filter the signal 402 to generate the signal 403. The loop filter 420 may be implemented as a continuous-time loop filter or a discrete-time loop filter.

The feedback digital-to-analog converter 440 comprises circuitry operable to convert the digital code 404 to analog voltage or current 441. In an example implementation, the DAC 440 comprises N thermometric units and is configured to receive the input 404 in thermometric format.

In the modulator 400, the shuffled outputs of flash ADC 430 also shuffle the feedback digital-to-analog converter's thermometric units. This technique helps to mitigate the effect of undesired spurious tones produced due to mismatches in feedback digital-to-analog converter units, without adding any extra delay in the voltage-to-code and code-to-voltage loop while implementing dynamic element matching for the feedback digital-to-analog converter.

The analog-to-digital converter 310 may be any of the analog-to-digital converters 100 or 200 of FIG. 1A to FIG. 2.

The RF front end circuit 304 is operable to receive a signal 301 via a communication channel (e.g., wired or wireless) and convert the received signal 301 to analog signal 112.

The analog-to-digital converter 100 converts the analog signal 112 to digital signal 109 as described above.

The demodulator circuit 308 then processes the digital signal 109 to recover information carried in the signal.

In an example implementation of this disclosure, an analog-to-digital converter circuit (e.g., 100) comprises code-shuffling circuitry (e.g., 102), a plurality of digital-to-analog converter circuits (e.g., 104_1 to 104_N), a plurality of difference circuits (e.g., 106_1 to 106_N or 202_1 to 202_N), and a plurality of latch circuits (e.g., 108_1 to 108_N). The code-shuffling circuitry is operable to shuffle, over time, a plurality of digital codes (e.g., 101_1 to 101_N) among a plurality of outputs of the code-shuffling circuitry (e.g., 103_1 to 103N). The plurality of digital-to-analog converter circuits are coupled, respectively, to the plurality of outputs of the code-shuffling circuitry; and operable to convert a digital code on the respective one of the outputs to a corresponding one of a plurality of analog reference voltages (e.g., 105_1 to 105_N in FIGS. 1A to 1C or 107_1 to 107_N in FIG. 2). The plurality of difference circuits is operable to generate a respective one of a plurality of difference signals (e.g., 107_1 to 107_N in FIGS. 1A to 1C) corresponding to a difference between an input voltage (e.g., 110) and a respective one of the plurality of reference voltages. The plurality of latch circuits is operable to latch a respective one of the plurality of difference signals (e.g., 107_1 to 107_N) to a corresponding one of a plurality of digital values (e.g., 109_1 to 109_N). Each of the plurality of digital-to-analog converter circuits may be coupled to the respective one of the plurality of outputs of the code-shuffling circuitry via a respective one of a plurality of sample and hold circuits (e.g., 113_1 to 113_N). One or more of the plurality of difference circuits may be an active subtractor (e.g., 106_1 to 106_N). One or more of the plurality of difference circuits may be a passive subtractor (e.g., 107_1 shorted to Vin via 202_1). The system may comprise dynamic element matching circuitry (e.g., 111) operable to control the code-shuffling circuitry based on one or more outputs of the plurality of latch circuits. The code-shuffling circuitry may be operable to shuffle the digital codes periodically (e.g., every N (an integer) cycles of a clock signal.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y". As another example, "x, y, and/or z" means any element of the seven-element set $\{(x), (y), (z), (x, y), (x, z), (y, z), (x, y, z)\}$. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
an analog-to-digital converter circuit comprising:
code-shuffling circuitry operable to shuffle, over time, a plurality of digital codes among a plurality of outputs of the code-shuffling circuitry;
a plurality of digital-to-analog converter circuits, each of which is
coupled to a respective one of the plurality of outputs of the code-shuffling circuitry; and
operable to convert a digital code on the respective one of the plurality of outputs to a corresponding one of a plurality of analog reference voltages;
a plurality of difference circuits, each of which is operable to generate a respective one of a plurality of difference signals corresponding to a difference between an input voltage and a respective one of the plurality of analog reference voltages; and
a plurality of latch circuits, each of which is operable to latch a respective one of the plurality of difference signals to a corresponding digital value.

2. The system of claim 1, wherein each of the plurality of digital-to-analog converter circuits is coupled to the respective one of the plurality of outputs of the code-shuffling circuitry via a respective one of a plurality of sample and hold circuits.

3. The system of claim 1, wherein each of the plurality of digital-to-analog converter circuits is a resistive digital-to-analog converter circuit.

4. The system of claim 1, wherein one or more of the plurality of difference circuits is an active subtractor.

5. The system of claim 1, wherein one or more of the plurality of difference circuits is a passive subtractor.

6. The system of claim 5, wherein an output impedance of each of the plurality of digital-to-analog converter circuits is independent of a voltage at its input.

7. The system of claim 6, wherein an output of each of the plurality of digital-to-analog converter circuits is shorted to an input of a respective one of the plurality of latch circuits via a determined impedance.

8. The system of claim 1, comprising dynamic element matching circuitry operable to control the code-shuffling circuitry based on one or more outputs of the plurality of latch circuits.

9. The system of claim 1, wherein the code-shuffling circuitry is operable to shuffle the plurality of digital codes periodically.

10. The system of claim 1, wherein an output of the analog-to-digital converter circuit is feedback via a thermometric feedback digital-to-analog converter.

11. A method comprising:
shuffling over time, by code-shuffling circuitry of an analog-to-digital converter, a plurality of digital codes among a plurality of outputs of the code-shuffling circuitry;
converting, a plurality of digital-to-analog converter circuits of the analog-to-digital converter, the plurality of digital codes on the plurality of outputs of the code-shuffling circuitry to a plurality of analog reference voltages;
generating, by a plurality of difference circuits, a plurality of difference signals, each of which corresponds to a difference between an input voltage and a respective one of the plurality of analog reference voltages; and
latching, by a plurality of latch circuits, the plurality of difference signals to a corresponding plurality of digital values.

12. The method of claim 11, wherein the plurality of digital-to-analog converter circuits receive the plurality of digital codes on the plurality of outputs of the code-shuffling circuitry via a plurality of sample-and-hold circuits.

13. The method of claim 11, wherein each of the plurality of digital-to-analog converter circuits is a resistive digital-to-analog converter circuit.

14. The method of claim 11, wherein one or more of the plurality of difference circuits is an active subtractor.

15. The method of claim 11, wherein one or more of the plurality of difference circuits is a passive subtractor.

16. The method of claim 15, wherein an output impedance of each of the plurality of digital-to-analog converter circuits is independent of a voltage at its input.

17. The method of claim 16, wherein an output of each of the plurality of digital-to-analog converter circuits is shorted to an input of a respective one of the plurality of latch circuits via a determined impedance.

18. The method of claim 11, comprising controlling, via dynamic element matching circuitry, the code-shuffling circuitry based on one or more outputs of the plurality of latch circuits.

19. The method of claim 11, wherein the shuffling over time of the plurality of digital codes comprises periodically shuffling.

20. The method of claim 11, comprising converting, by a feedback digital-to-analog converter, an output of the analog-to-digital conversion circuit to an analog signal.

* * * * *